United States Patent [19]
Itoh et al.

[11] Patent Number: 5,795,401
[45] Date of Patent: Aug. 18, 1998

[54] METHOD FOR SCRUBBING SUBSTRATE

[75] Inventors: Takashi Itoh; Hiroyuki Saitoh; Haruyuki Kinami; Toshinori Konaka; Tsuyoshi Murai, all of Tokyo, Japan

[73] Assignee: M. Setek Co., Ltd., Japan

[21] Appl. No.: 729,077

[22] Filed: Oct. 10, 1996

Related U.S. Application Data

[60] Continuation of Ser. No. 441,924, May 16, 1995, abandoned, which is a division of Ser. No. 301,562, Sep. 7, 1994, Pat. No. 5,465,447.

[30] Foreign Application Priority Data

Nov. 30, 1993 [JP] Japan ............................ 5-329820
Apr. 28, 1994 [JP] Japan ............................ 6-114779

[51] Int. Cl.$^6$ ............................ B08B 1/04; B08B 3/02
[52] U.S. Cl. ............................ 134/6; 134/7; 134/32; 134/33; 134/26
[58] Field of Search ............................ 134/6, 7, 32, 33, 134/26

[56] References Cited

U.S. PATENT DOCUMENTS

| | | | |
|---|---|---|---|
| 3,479,222 | 11/1969 | David et al. | 134/33 |
| 4,109,337 | 8/1978 | Hillman et al. | 15/21 D |
| 5,092,011 | 3/1992 | Gommori et al. | 15/88.2 |
| 5,345,639 | 9/1994 | Tanoue et al. | 15/88.2 |

*Primary Examiner*—Zeinab El-Arini
*Attorney, Agent, or Firm*—Armstrong, Westerman, Hattori, McLeland & Naughton

[57] ABSTRACT

An improved method for scrubbing a substrate, the method including the step of scrubbing one face of the substrate with a cylindrical rotary brush while applying back pressure to the substrate by jetting a fluid for generating back pressure against the other face of the substrate.

4 Claims, 21 Drawing Sheets

METHOD FOR SCRUBBING SUBSTRATE

This application is a continuation of application Ser. No. 08/441,924 filed May 16, 1995, now abandoned; which is a division of application Ser. No. 08/301,562 filed Sep. 7, 1994, now U.S. Pat. No. 5,465,447.

BACKGROUND OF THE INVENTION

1. Field Of The Invention

The present invention relates to method and apparatus for scrubbing either face or both faces of a substrate with a cylindrical brush while chucking only the periphery of the substrate.

2. Description Of The Prior Art

Recently, semiconductor devices have been evolved from very large scale integration (VLSI) into ultra large scale integration (ULSI). On a surface of a semiconductor substrate, very minute circuits are densely formed using a precision photolithographic technique. In the production process, microscopic dust particles adhering on the surface of the semiconductor substrate will result in defective semiconductor circuits and reduce the production yield. The production cost steeply rises, as the degree of integration of semiconductor devices increases. Therefore, an improvement in the production yield will largely contribute to the cost reduction, and the removal of dust particles is a very important subject.

At the production site of semiconductor devices, although the cleaning of the front face of a semiconductor substrate on which microcircuits are formed is strictly controlled, control on the cleaning of the back face is not so strict at present. During the production processes, the back face of the semiconductor substrate is brought into contact with suction bases of equipment and handling devices, and becomes contaminated. The contamination of the back face is found to be one of the causes of the contamination of the front face.

Though sufficient cleaning of the back face of the semiconductor substrate has recently been added to the production process, there still exist problems as follows:

(1) Since microcircuits are densely formed on the front face of a semiconductor substrate as previously mentioned, the substrate cannot be supported at the front face thereof for the scrubbing of the back face thereof. Accordingly, the semiconductor substrate has to be supported by chucking the periphery of the substrate with a chuck jaw without supporting a central portion of the front face of the substrate for the scrubbing of the back face. However, since a chuck jaw for chucking the periphery of the substrate slightly projects outwardly of the scrub face of the substrate, a disk brush as shown in FIG. 21 which has a small scrubbing area and hence is of an insufficient scrubbing ability is conventionally used for the scrubbing.

(2) When the back face of the semiconductor substrate is scrubbed with a scrubbing means such as a brush with its periphery being chucked by the chuck jaw as described above, the thin semiconductor substrate is warped by the contact pressure of the brush, so that a central portion of the substrate cannot be sufficiently scrubbed.

(3) Since the chuck jaw projects outwardly of the scrub surface of the semiconductor substrate as described above, peripheral portions of the substrate adjacent the projections of the chuck jaw cannot be sufficiently scrubbed, and some part of the scrub surface remains unscrubbed.

Another problem associated with the production of semiconductor devices is dust particles suspended in the air. Although a production apparatus for semiconductor devices which is related to the present invention is used in a clean room and the amount of dust particles suspended in the air is significantly reduced, there exists a very small amount of suspended dust particles. After the scrubbing of the substrate, these dust particles will adhere onto the surfaces of the substrate charged by static electricity, and the scrubbed surface of the substrate will become contaminated.

In view of the problems associated with the prior art, it is an object of the present invention to provide method and apparatus for scrubbing a substrate which present an enhanced scrubbing ability.

It is another object of the present invention to provide method and apparatus for scrubbing a substrate which prevent a central portion of the semiconductor substrate from being warped by the contact pressure of a brush during the scrubbing operation so as to sufficiently scrub even the central portion.

It is still another object of the present invention to provide method and apparatus for scrubbing a substrate which are capable of scrubbing even peripheral portions of the substrate lying very close to the projections of a chuck jaw for chucking the substrate.

It is a further object of the present invention to provide method and apparatus for scrubbing a substrate which prevent suspended dust particles from adhering onto the substrate by removing electrostatic charge after the scrubbing of the substrate.

SUMMARY OF THE INVENTION

According to a first aspect of the present invention, there is provided a method for scrubbing a substrate comprising the step of scrubbing one face of the substrate with a cylindrical rotary brush while applying back pressure to the substrate by jetting a fluid for generating back pressure against the other face of the substrate.

With, this method, while only the periphery of the substrate is chucked, even a central portion of the substrate can forcibly be scrubbed by virtue of the back pressure applied thereto, and no portion of the surface remains unscrubbed.

According to a second aspect of the present invention, there is provided a method for scrubbing a substrate comprising the step of scrubbing both faces of the substrate with cylindrical rotary brushes disposed on the both sides of the substrate symmetrically with respect to the substrate.

With this method, the pressure applied to one face of the substrate is balanced with the pressure applied to the other and, hence, even a central portion which is difficult to scrub can be effectively scrubbed without warpage of the substrate.

Preferably, the method according to the first or second aspect of the present invention further comprising the step of, after scrubbing the substrate, drying the substrate and then removing electrostatic charge from the substrate with a charge removal means.

The substrate is brought into contact with a cylindrical rotary brush and a wash liquid when scrubbed, and then centrifugally dried by rotating the substrate at a high speed. At this time, the friction caused by the contact between the substrate and the cylindrical rotary brush and/or wash liquid (especially where the wash liquid is high purity water) and between the substrate and the ambient air sometimes generates electrostatic charge on the substrate. Such electrostatic charge can be effectively removed by the aforementioned charge removing means. This prevents dust particles suspended in the air from adhering onto the substrate and enables the substrate to be kept clean after the scrubbing.

According to a third aspect of the present invention, there is provided an apparatus for scrubbing a substrate comprising: a substrate chuck having a clamp groove formed therein for receiving the periphery of the substrate and a substrate chucking jaw which is adapted to be positioned inward relative to a face to be scrubbed of the substrate and serves as a chucking projection forming part of the clamp groove; a back pressure paddle for jetting fluid for generating back pressure against the opposite face of the substrate to apply back pressure to the substrate; a cylindrical rotary brush adapted to contact the face to be scrubbed of the substrate from one end to the other end thereof for scrubbing the face to be scrubbed of the substrate; and a rotation mechanism for rotating the substrate chuck or the cylindrical rotary brush within a plane parallel to the substrate.

With this apparatus, the substrate is scrubbed with only the periphery thereof being chucked while a high contact pressure is applied to a central portion of the substrate; thus, even the central portion which has been unable to be sufficiently scrubbed by a conventional apparatus can be effectively scrubbed. Since the chuck jaw for chucking the periphery of the substrate is adapted to be positioned inward relative to the face to be scrubbed of the substrate, the brush never contacts the chuck jaw. Therefore, the brush can be moved extensively even beyond the circumference of the substrate to scrub the substrate. This ensures an improved scrubbing efficiency and minimizes an unscrubbed portion remaining in the periphery of the substrate.

According to a fourth aspect of the present invention, there is provided an apparatus for scrubbing a substrate comprising: a substrate chuck having a clamp groove formed therein for receiving the substrate and chuck jaws which are adapted to be positioned inward relative to both faces of the substrate, respectively, and serve as chucking projections forming part of the clamp groove; upper and lower cylindrical rotary brushes provided on both sides of the substrate and adapted to contact the both faces of the substrate from one end to the other end thereof for scrubbing the both faces of the substrate; and a rotation mechanism for rotating the substrate chuck or the upper and lower cylindrical rotary brushes within a plane parallel to the substrate.

With this apparatus, in addition to the advantages of the foregoing apparatus according to the third aspect, the both faces of the substrate can be simultaneously scrubbed.

According to a fifth aspect of the present invention, there is provided an apparatus for scrubbing a substrate comprising: a substrate chuck adapted to surround the substrate and having a clamp groove formed therein for receiving generally entire peripheral portion of the substrate and fluid drain through-holes provided along the clamp groove and extending from the upper surface to the lower surface thereof; a back pressure paddle for jetting fluid for generating back pressure against the face opposite a face to be scrubbed of the substrate to apply back pressure to the substrate; a cylindrical rotary brush adapted to contact the face to be scrubbed of the substrate for scrubbing the same; and a rotation mechanism for rotating the substrate chuck or the cylindrical rotary brush within a plane parallel to the substrate.

The fluid for generating back pressure discharged from the back pressure paddle onto the substrate is thrust away toward the circumference of the substrate by the centrifugal force generated by the rotation of the substrate chuck, and is effectively drained from the fluid drain through-holes provided along the clamp groove. Therefore, the upper surface of the substrate can be kept clean.

In addition, where the water adhering on the substrate is centrifugally removed by rotating the substrate at a high speed after the completion of scrubbing, the water removed is effectively drained from the fluid drain through-holes.

According to a sixth aspect of the present invention, there is provided an apparatus for scrubbing a substrate comprising: a substrate chuck adapted to surround the substrate and having a clamp groove formed therein for receiving generally entire peripheral portion of the substrate and fluid drain through-holes provided along the clamp groove and extending from the upper surface to the lower surface thereof; upper and lower cylindrical rotary brushes provided on both sides of the substrate and adapted to contact both faces of the substrate, respectively, for scrubbing the both surfaces of the substrate; and a rotation mechanism for rotating the substrate chuck or the upper and lower cylindrical rotary brushes within a plane parallel to the substrate.

With this apparatus, like the fifth case, wash water will not remain on the upper face of the substrate but is smoothly drained even in a simultaneous two-face scrubbing operation, resulting in an effective simultaneous two-face scrubbing operation.

Preferably, the apparatus according to any one of the third to sixth aspects of the present invention further comprises a charge removal means provided in a substrate scrubbing station and/or a substrate transporting path for removing electrostatic charge on the substrate after the completion of scrubbing.

As with the scrubbing methods stated above, the electrostatic charge generated on the substrate during or after scrubbing is effectively removed with the charge removal means. Therefore, the substrate will not attract dust particles suspended in the air and can be kept clean after scrubbing.

For a more complete understanding of the above and other features and advantages of the invention, reference should be made to the following detailed description of preferred embodiments of the invention, and to the accompanying drawings.

DETAILED DESCRIPTION OF THE PREFERRED EMBODIMENTS

Figure 1:
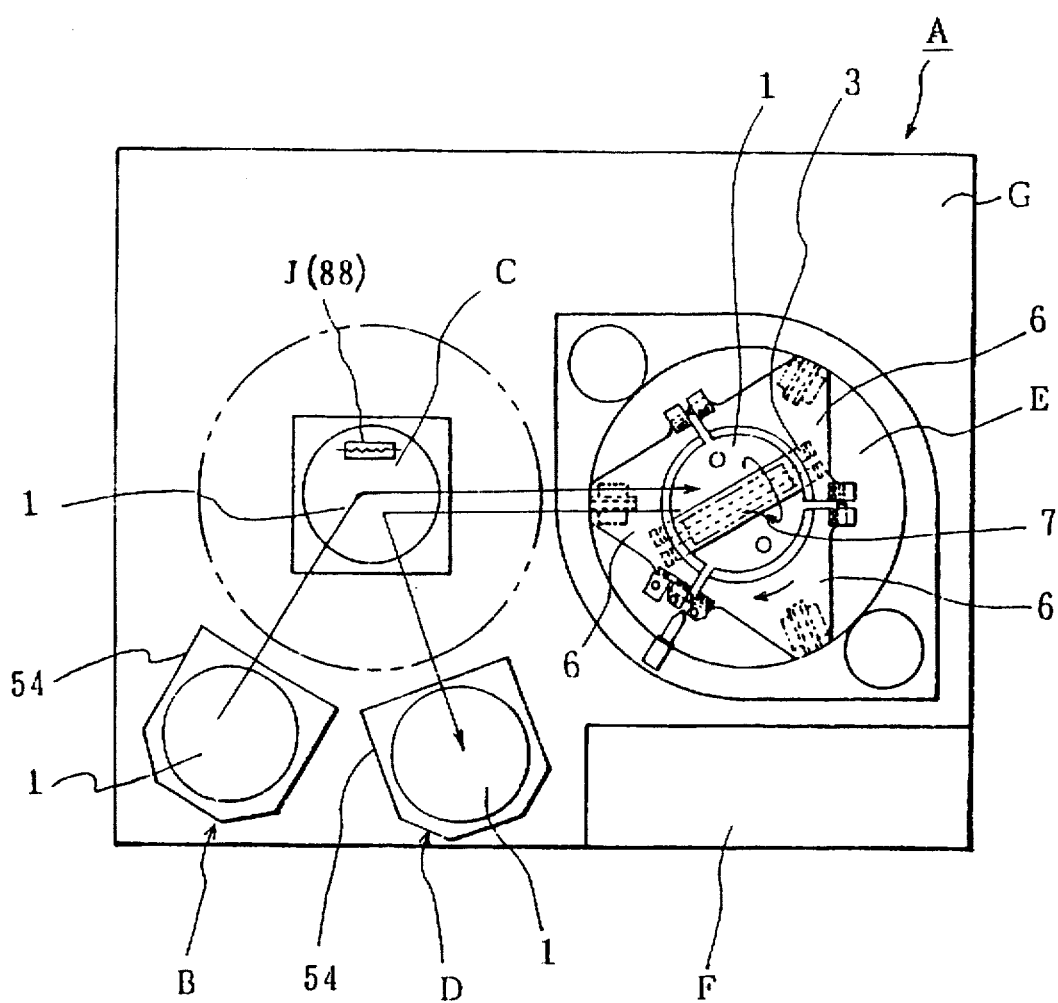
FIG. 1 is a plan view wholly showing a scrubbing apparatus in accordance with the present invention.

The present invention will now be described in detail by way of the embodiments illustrated in the attached drawings. In these embodiments is used a semiconductor wafer as an example of a substrate. However, the present invention is also applicable to other thin plates such as glass plate, alumina plate, crystal plate, ceramic plate, sapphire plate, aluminum disc and the like. Referring to FIG. 1, a scrubbing apparatus A includes a scrubbing station E for scrubbing a substrate 1, a transportation robot C for transporting the substrate 1 into and out of the scrubbing station E, a loader B for supplying the substrate 1 to the transportation robot C, an unloader D for storing a scrubbed substrate 1, a controller F for controlling the entire apparatus, and a main body G for accommodating these components.

The loader B prepares an unscrubbed substrate 1 accommodated in a cassette 54; which is raised or lowered step by step in synchronization with the take-out operation of the transportation robot C to move the unscrubbed substrate 1 into a predetermined position.

The unloader D prepares an empty cassette 54 for accommodating a scrubbed substrate 1 to be transported by the transportation robot C after the back-face scrubbing at the scrubbing station E. The cassette 54 is raised or lowered step by step in synchronization with the supply of the substrate 1.

The transportation robot C takes the unscrubbed substrate 1 out of the loader B to supply the substrate 1 to the scrubbing station E. After the back-face scrubbing at the scrubbing station E, the transportation robot C removes the scrubbed substrate 1 from the scrubbing station E to transport the substrate 1 to the unloader D.

At the location of the transportation robot C, an ultraviolet ray generating lamp 88 is provided as a dust removal means J. The operation of the ultraviolet ray generating lamp 88 will be described later.

The structures of the loader B, unloader D, and transportation robot C are well known in the art, and therefore will not be described in detail herein.

Figure 2:
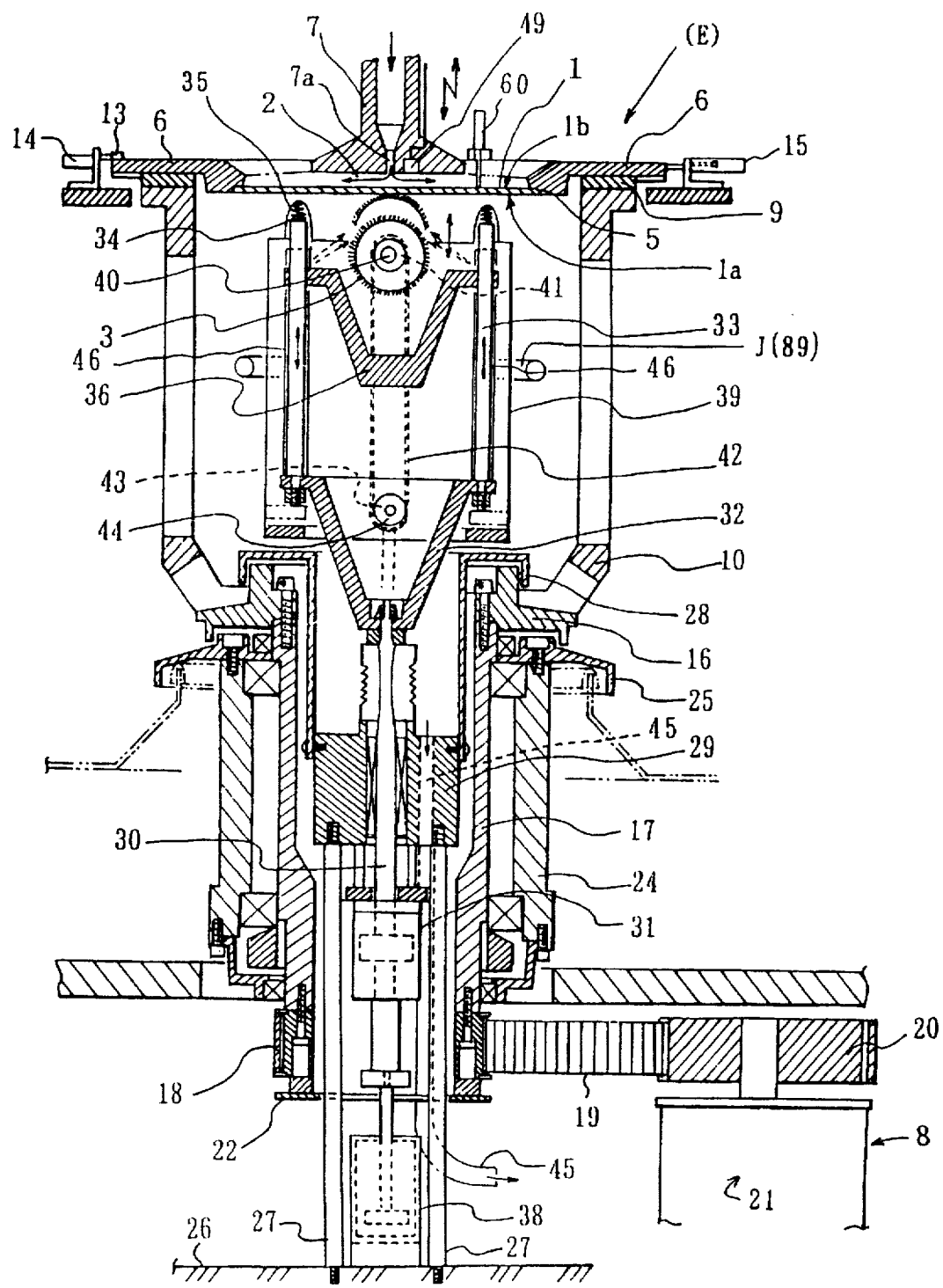
FIG. 2 is a vertical sectional view of a scrubbing station of a scrubbing apparatus in accordance with the present invention.
Figure 3:
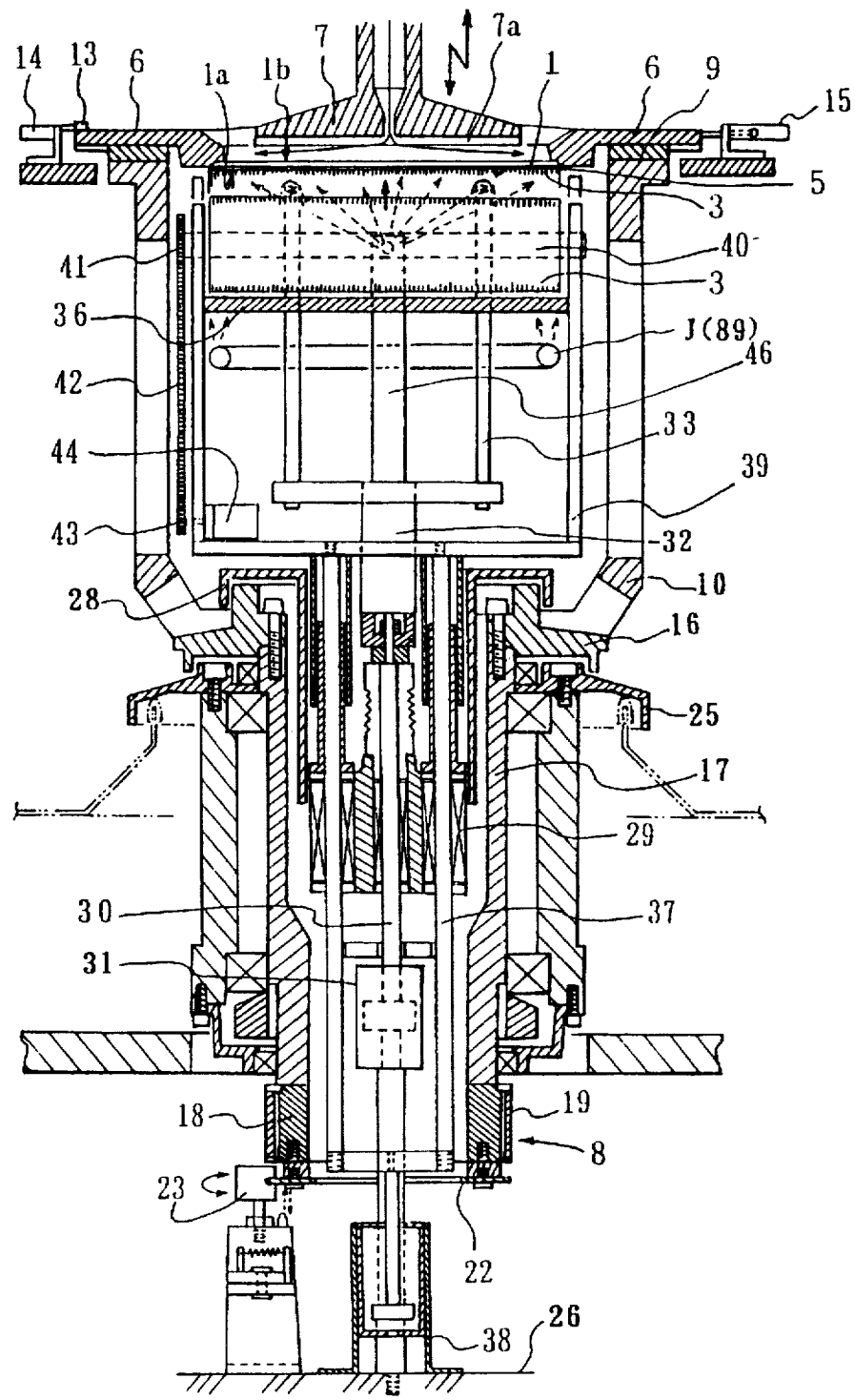
FIG. 3 is a vertical sectional view in an orthogonal relation to FIG. 2.

FIGS. 2 and 3 are sectional views of the scrubbing station E in accordance with the present invention. A substrate chuck 6 is slidably mounted on a upper-rotary housing 10 by way of sliders 9.

The substrate chuck 6 is of annular shape and divided into three pieces. The chuck diameter of the substrate chuck 6 is scalable, as can be seen from FIGS. 4 and 5. The substrate chuck 6 has a self-centering clamp groove 4 formed along inner circumference thereof so as to chuck the entire periphery of the thin substrate 1.

Figure 6:
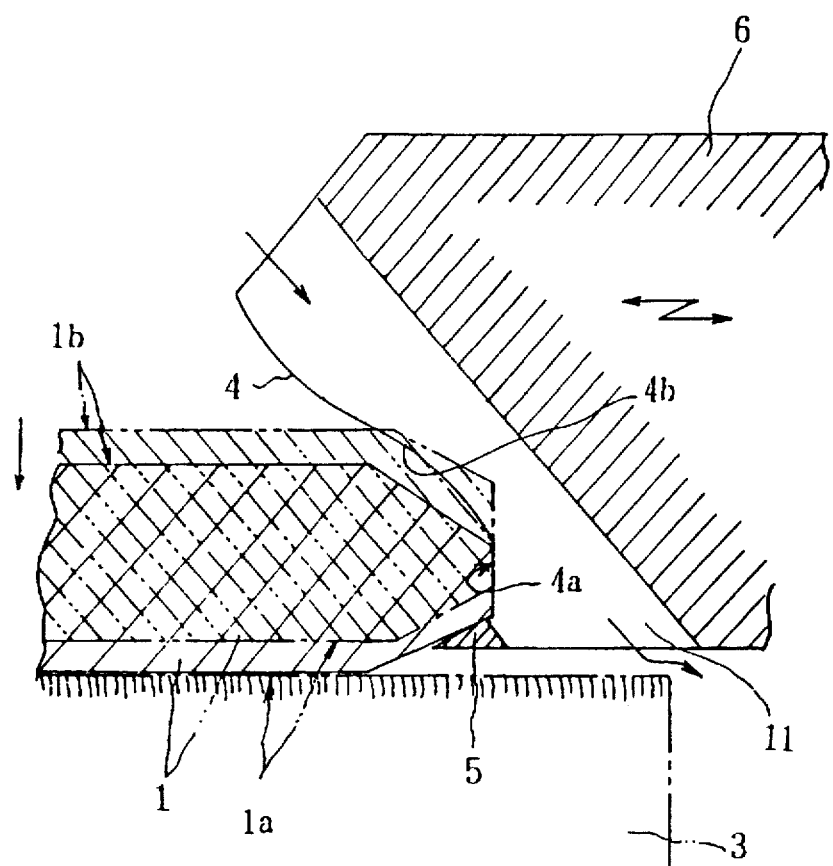
FIG. 6 is an enlarged sectional view for illustrating the relation between a substrate and a clamp groove in accordance with the present invention.

FIG. 6 is a partially enlarged sectional view of the self-centering clamp groove 4 which is formed in the inner circumference of the substrate chuck 6. The self-centering clamp groove 4 is defined by the inside surface 4a abutting against the circumference of the substrate 1, a jaw 5 positioned at the lower end of the inside surface 4a for supporting the lower tapered surface of the substrate 1, and an upper slide oblique surface 4b positioned above the jaw 5. In the embodiment shown in FIG. 6, the upper slide oblique surface 4b is slightly curved to be followed by the inside surface 4a and has such sectional configuration as the surface line is slightly waved in S-shape. Therefore, the periphery of the substrate 1 received in the self-centering clamp groove 4 slightly slides along the upper slide oblique surface 4b and fits within the inside surface 4a, and the tapered peripheral portion of the substrate 1 is supported by the jaw 5. The jaw 5 is slightly engaged with the lower tapered surface of the substrate 1, and does not project downwardly of the surface to be scrubbed 1a (the lower face) of the substrate 1. The surface to be scrubbed will hereinafter be called "scrub surface" for convenience.

A plurality of fluid drain through-holes 11 are formed at certain intervals in the vicinity of the inner circumference of the substrate chuck 6, and the major axis of the elliptical through-hole 11 extends along the tangent line of the self-centering clamp groove 4. The fluid drain through-hole 11 extends downwardly obliquely from the inside surface to the lower surface of the substrate chuck 6. Fluid discharged onto the back pressure applied surface 1b of the substrate 1 is smoothly drained through the fluid drain through-holes 11 to the lower side of the substrate chuck 6.

Figure 4:
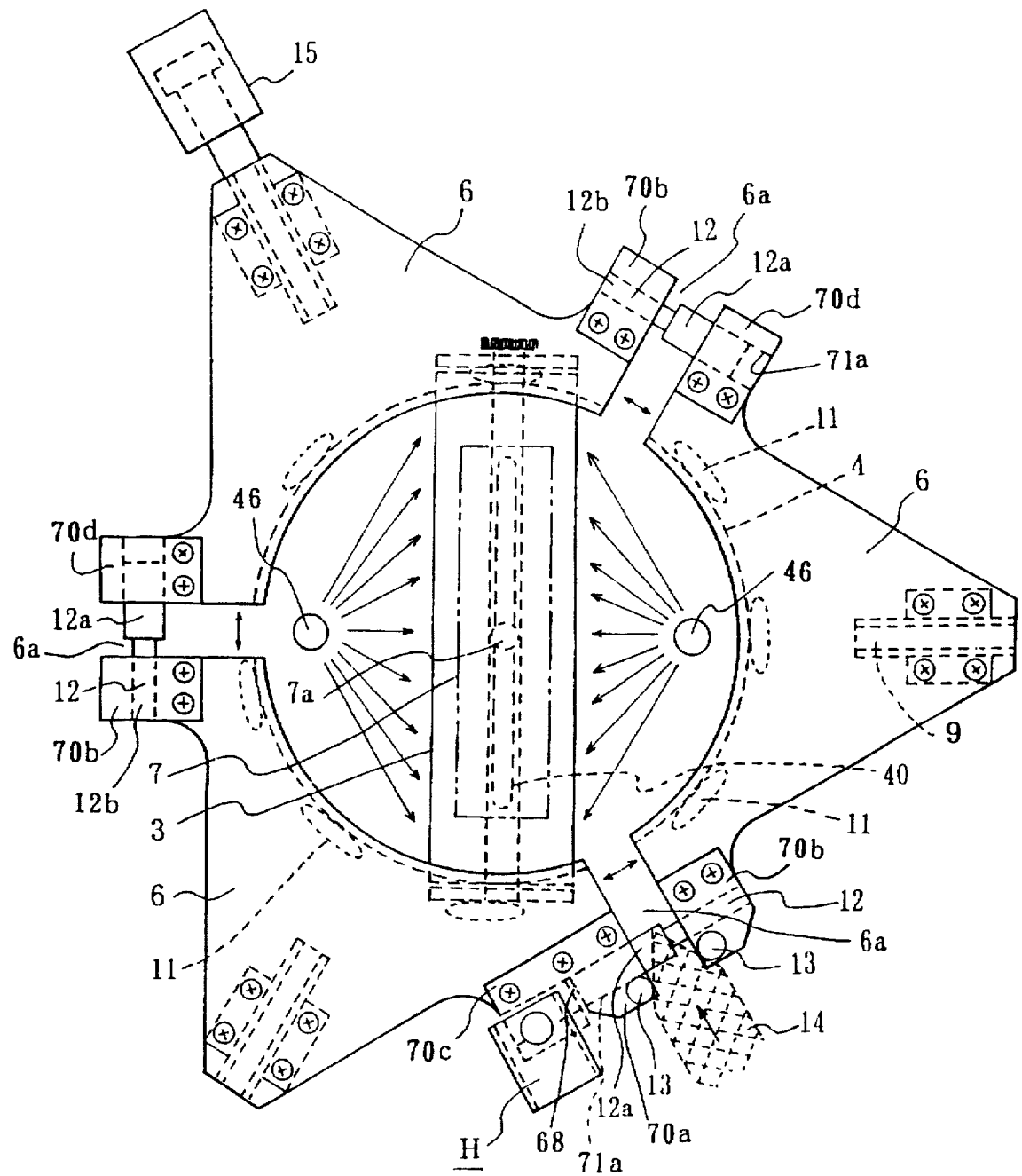
FIG. 4 is a plan view of the scrubbing station in an opened state.

Three pieces of the substrate chuck 6, FIG. 4, are connected by means of scalable guides 12 fixed onto roller mounting blocks 70b. A slide member 12a of the scalable guide 12 is slidably held in a slide opening 71a formed in a roller mounting block 70a of the adjacent substrate chuck piece 6. As shown in FIG. 4, the clearance between adjacent substrate chuck pieces 6 is expanded by inserting an expansion cylinder head 14 between expansion rollers 13 provided at the ends of the adjacent pair of the substrate chuck pieces 6. At this time, the slide member 12a is moved away from the slide opening 71a.

Figure 5:
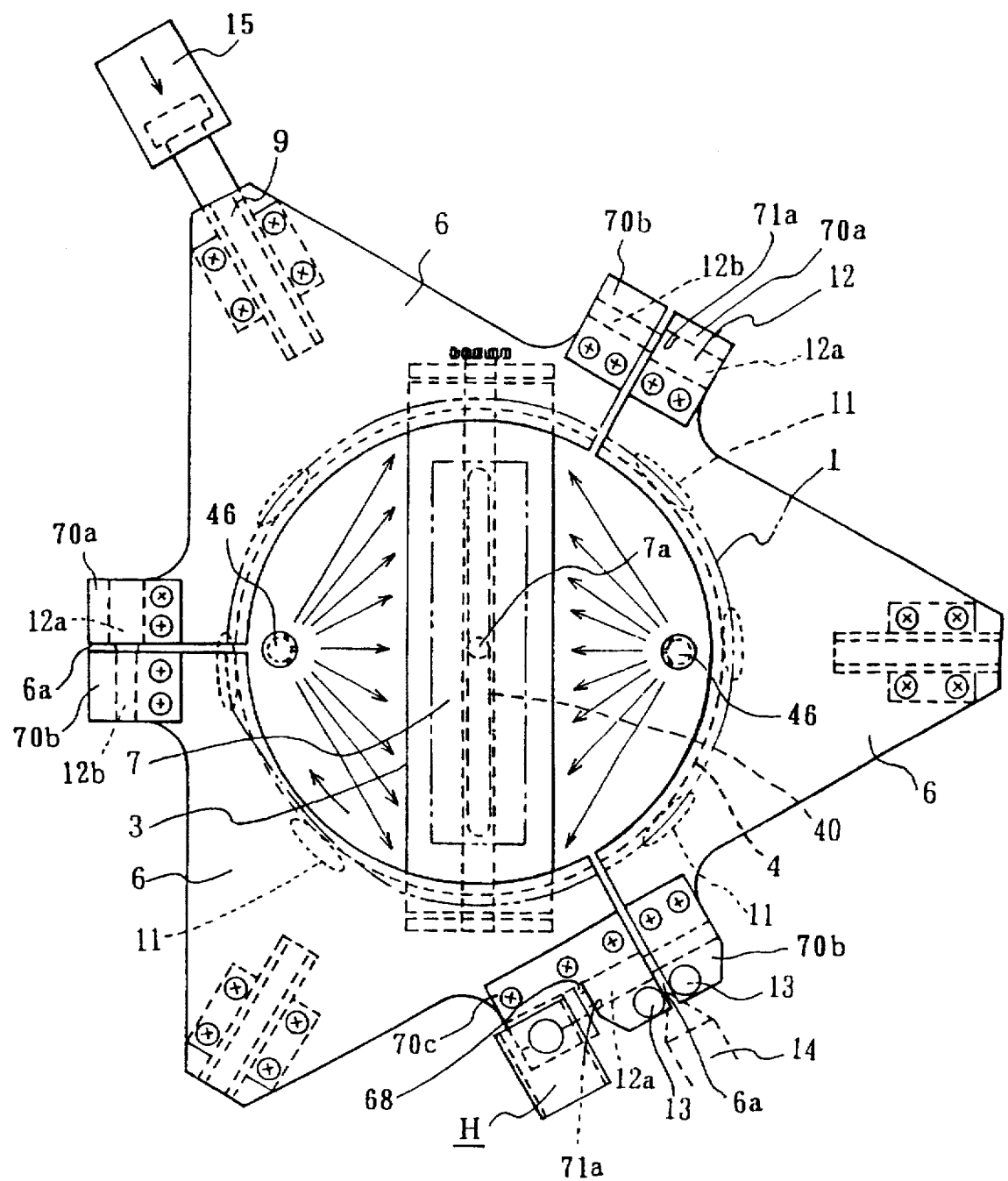
FIG. 5 is a plan view of the scrubbing station in a closed state.

The scalability of the substrate chuck 6 is slidably adjusted by sliders 9 provided on the lower side of the substrate chuck 6. The chuck diameter of the substrate chuck 6 is increased by the expansion cylinder heads 14 as described above, and is reduced by chuck diameter reduction cylinders 15 each provided in a position opposite the expansion cylinder head, 14. That is, the substrate chuck 6 is pushed inward by the operation of the chuck diameter reduction cylinders 15, and the slide members 12a are pushed back into the slide openings 71a, whereby the entire substrate chuck 6 is closed as shown in FIG. 5. At this time, the expansion cylinder heads 14 are pulled back.

When the substrate chuck 6 is closed to chuck the periphery of the substrate chuck 1 within the self-centering clamp groove 4, one of the scalable guides 12 is locked by a lock mechanism H. Therefore, the substrate chuck 6 does not open by centrifugal force generated by the rotation of the substrate chuck 6. The lock mechanism will be described later.

The upper rotary housing 10 FIGS. 2 and 3 is connected to a rotary drum 17 by means of a rotary head cover 16. A coupled driving pulley 18 is mounted to the rotary drum 17 and connected to a driving pulley 20 of a motor 21 for rotating substrate by means of a driving belt 19. Accordingly, the torque of the motor 21 for rotating substrate is transmitted to the coupled driving pulley 18 to rotate the substrate chuck 6. A positioning cam 22 is mounted to the coupled driving pulley 18. A positioning cam follower 23 is adapted to be fitted into the groove of the positioning cam 22 so that the substrate chuck 6 can be forcibly stopped in a predetermined position at any time. To ensure that the positioning cam follower 23 is exactly received in the groove of the positioning cam 22 at any time, the stopping position is always monitored by a positioning sensor. This is well known in the art, and therefore will not be described in detail herein.

Figure 7:
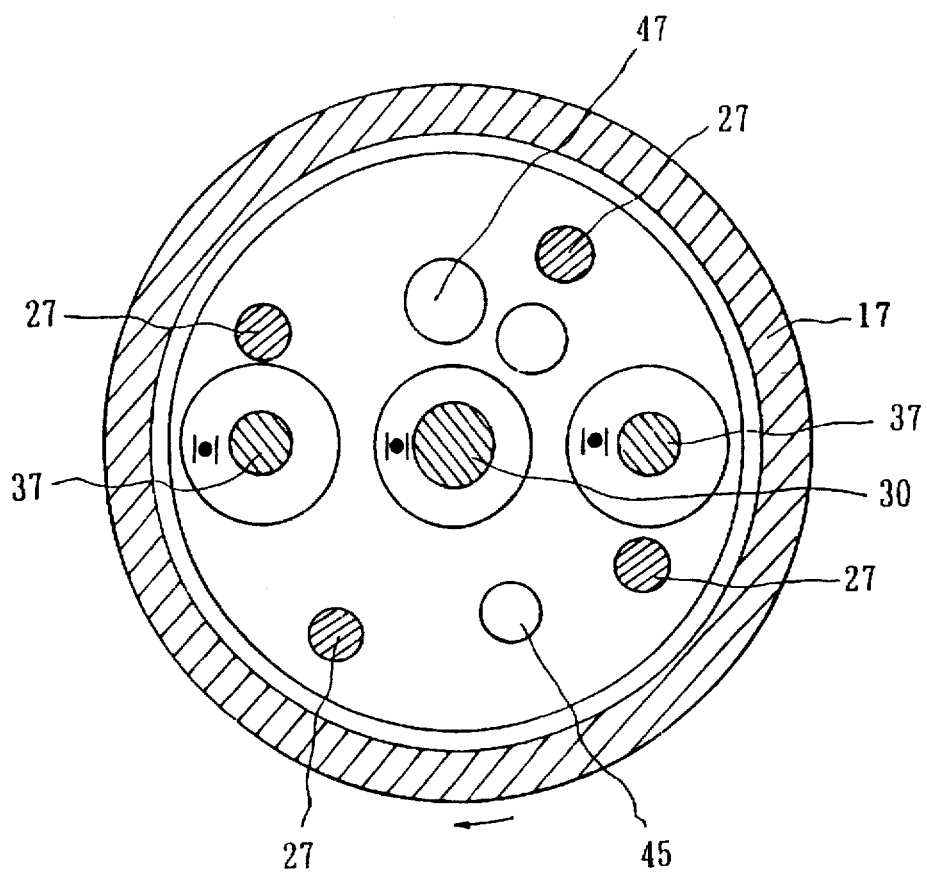
FIG. 7 is a sectional view of the body portion of the scrubbing station.
Figure 8:
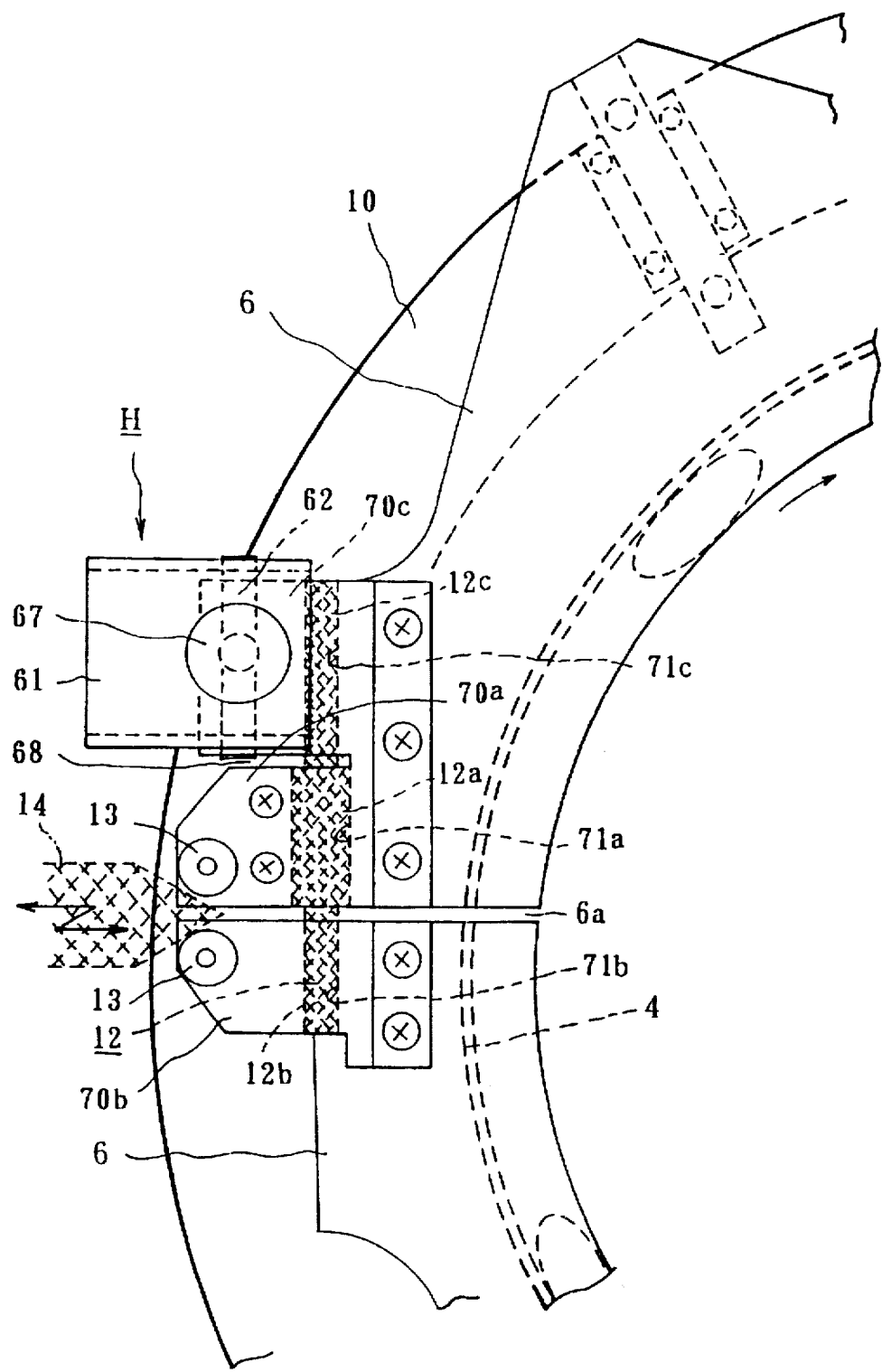
FIG. 8 is a partial plan view of a lock mechanism in accordance with the present invention.

A stationary housing 24 is fitted around the rotary drum 17, FIGS. 2 and 7 and rotatably supports the rotary drum 17 by means of a bearing.

A stationary splash protection cover 25 is provided on top of the stationary housing 24. Posts 27 are erected upwardly of a base plate 26, and a stationary block 29 is fixed on top of the posts 27.

A stationary head cover 28 is mounted on top of the stationary block 29, and covers the rotary head cover 16.

A substrate support cylinder rod 30 is slidably inserted into the center of the stationary block 29, and is elevatably driven by a substrate support operation cylinder 31 disposed below the stationary block 29.

Figure 16:
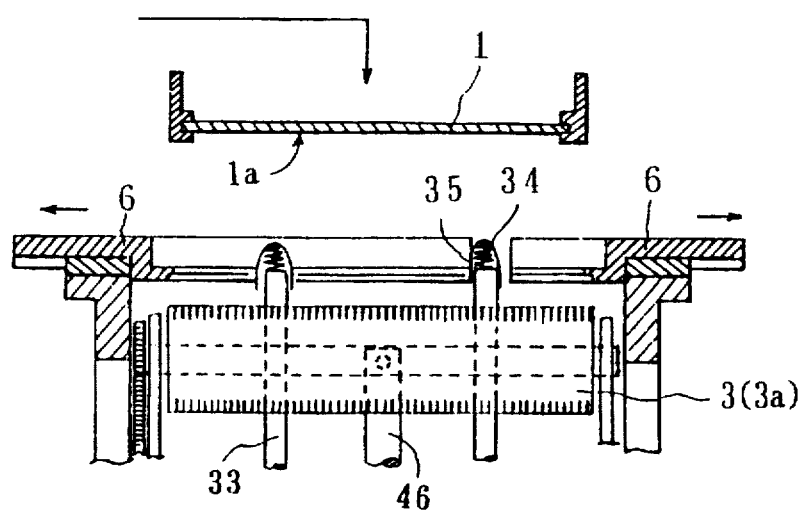
FIG. 16 is a schematic sectional view illustrating the scrubbing station before supplying a substrate in both-face scrubbing process.
Figure 17:
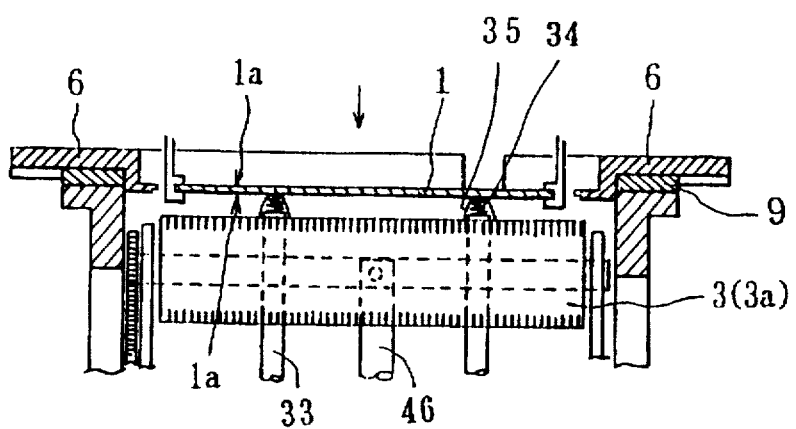
FIG. 17 is a schematic sectional view illustrating the scrubbing station after supplying the substrate in both-face scrubbing process.
Figure 18:
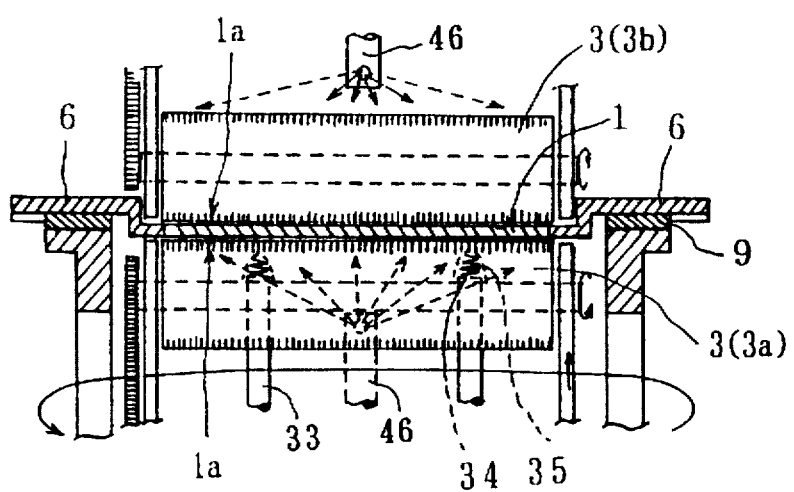
FIG. 18 is a schematic sectional view illustrating the scrubbing station in both-face scrubbing operation.

A substrate support intermediate member 32 having a V-shaped cross section is mounted on top of the substrate support cylinder rod 30, and substrate support rods 33 are erected upwardly of the substrate support intermediate member 32. In this embodiment, four substrate support rods 33 are provided, and their tip portions are covered with support heads 35 with cushion members 34 being interposed, FIGS. 16, 17 and 18.

A fluid receiving member 36 having a V-shaped cross. section is provided below a cylindrical brush 3.

Brush elevation bars 37 are slidably inserted into the stationary block 29. A brush elevation cylinder 38 is disposed at the lower end of the brush elevation bars 37 to raise and lower the brush elevation bars 37. On top of the brush elevation bars 37, a brush mounting member 39 is mounted to rotatably support the cylindrical brush 3 thereon.

The cylindrical brush 3 is rotatably supported around a rotary shaft 40, at one end of which a coupled brush driving pulley 41 is attached. A brush driving belt 42 is suspended on the coupled brush driving pulley 41, and is connected to a brush driving pulley 43 of a brush driving motor 44 to transmit the torque of the brush driving pulley 43 to the cylindrical brush 3. In this embodiment, a highly water-absorptive buff is used as the cylindrical brush 3, but not limited thereto. Long-haired or short-haired brushes are also used, depending on applications.

Figure 15:
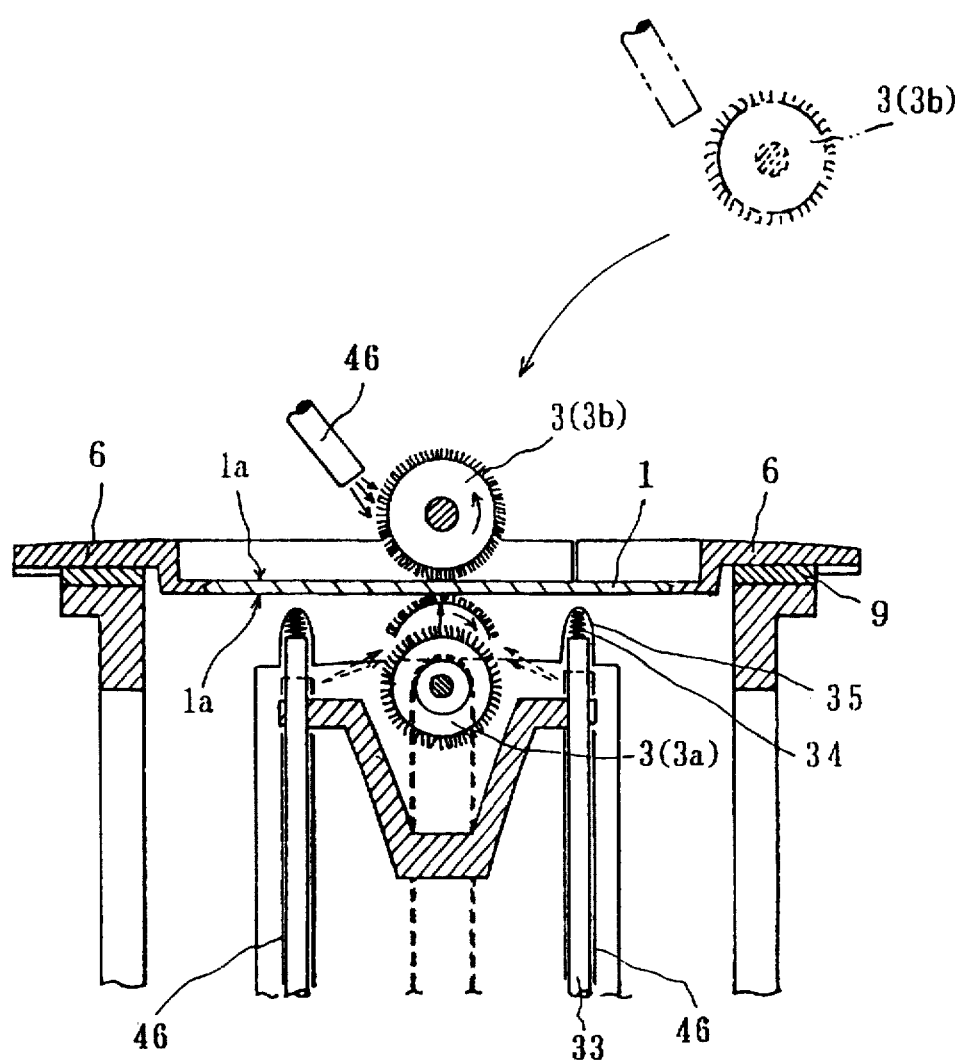
FIG. 15 is a schematic sectional view illustrating the scrubbing station in both-face scrubbing operation.

A drain pipe 45 is provided in the stationary block 29, and drains the fluid fallen onto the stationary block 29. A wash fluid jet nozzle 46 is connected to a wash fluid supply pipe 47 provided in the stationary block 29 to jet the wash fluid against the-cylindrical brush 3 from the tip of the wash fluid jet nozzle 46, FIG. 15. In this embodiment, high purity water is used as the wash fluid, but not limited thereto. Liquid such as alcohols, and inert gases such as nitrogen and argon gases are also usable as the wash fluid.

If extremely high purity water is used as a fluid 2 for generating back pressure, electrostatic charge may be built up in the substrate 1. Therefore, it is desirable to use high purity water with lower electric conductivity which contains carbon dioxide gas, in terms of the prevention of electrostatic charge.

If a gas is used as the wash fluid, it is also desirable to previously treat the gas by means of an ionizer.

A back pressure paddle 7 disposed right above the cylindrical brush 3 is adapted to be moved upwardly and downwardly with respect to the substrate 1, and is formed with a fluid jet outlet 7a at the center thereof. The fluid jet outlet 7a may be formed as a single hole opposing to the center of the substrate 1 and positioned right above the cylindrical brush 3, as a plurality of holes provided in a line along the cylindrical brush 3, or as a slit. In this embodiment, a slit-shaped fluid jet outlet 7a is formed in the lower surface of the back pressure paddle 7, and the back pressure fluid is discharged therefrom.

As described above, an inert gas such as nitrogen gas or liquid such as high purity water is used as the back pressure fluid.

Figure 20:
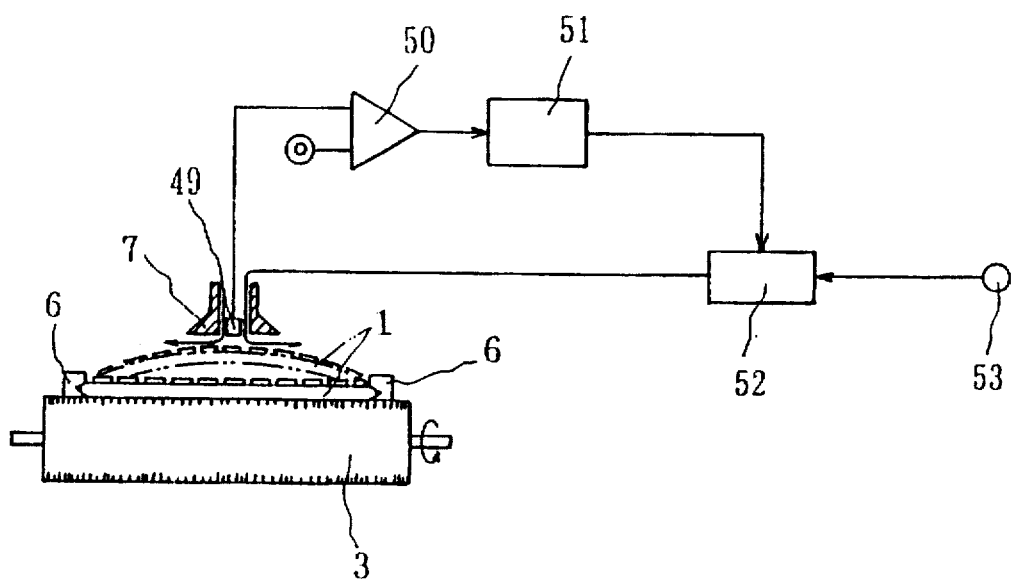
FIG. 20 is a block circuit diagram illustrating a displacement sensor used in the present invention.

A displacement sensor 49 is disposed within the back pressure paddle 7. The output from the displacement sensor 49 is input to one terminal of a comparator 50, FIG. 20 and compared with a reference voltage. The output from the comparator 50 indicative of a displacement amount is input to a driver 51. Based on the input, the driver 51 drives a regulator 52 to regulate the jet pressure of the back pressure fluid 2 discharged from the fluid jet outlet 7a. A fluid supply source 53 supplies the fluid 2 to the regulator 52 at a constant pressure. A block diagram illustrating the back pressure regulation mechanism is shown in FIG. 20.

There is now described the charge removal means J, FIG. 1 and 2 disposed at the location of the scrubbing station E and transportation robot C, FIG 1. In this embodiment, a lamp 88 such as deuterium lamp, mercury lamp, or barrier lamp is used as the charge removal means J, but not limited thereto. Electrostatic charge may be otherwise removed: (1) with an ionizer using corona discharge; (2) with isotopes; (3) with electron beam; (4) with plasma; and (5) with soft X-radiation. The use of lamp is the most convenient among these means, and does not generate harmful dust particles. This embodiment takes an example of dust-free charge removal mechanism using the aforementioned lamp for generating ultraviolet ray.

The charge removal mechanism using lamps 88 and 89 will be briefly described herein. The lamps 88 and 89 generate ultraviolet ray. A short wavelength ultraviolet ray serves to electrically neutralize the surface la of the substrate 1 to be made dust-free by ionizing the ambient gas at the location of the irradiation. A long wavelength ultraviolet ray generates photoelectrons to remove electrostatic charge from the substrate 1. That is, the ultraviolet ray generates photoelectrons from its sealed glass tube to remove positive electric charge from the substrate 1, and impinges on a charged body (substrate 1) which itself generates photoelectrons to remove negative electric charge.

There are three types of mercury lamps—extra-high pressure mercury lamp, high pressure mercury lamp, and low pressure mercury lamp. The low pressure mercury lamp is suitable for the use of short wavelength ultraviolet ray.

When ultraviolet ray is used for the charge removal, it is important to directly apply the ultraviolet ray onto the charged substrate 1. Since the generation of photoelectrons is enhanced with an increased energy, it is desirable to use short-wavelength and high-intensity ultraviolet ray.

There is now described the lock mechanism H FIGS. 4, 8, 9 and 10. The lock mechanism H grips the guide lock 12c FIGS. 8, 9, and 10 of the scalable guide 12 to prevent the substrate chuck 6 from being expanded by the centrifugal force generated by the rotation of the substrate chuck 6. A pair of roller mounting blocks 70a and 70b are provided at the juncture 6a of the substrate chuck pieces 6. A locking block 70c is integrally connected to the roller mounting block 70a, and an isolation gap 68 is formed between the roller mounting block 70a and locking block 70c. A locking shaft base 67 is erected on the top of the upper rotary housing 10, and extends through to the opening side of the locking block 70c. An operation lever 61 of a reversed U-shape is provided above the locking block 70c. A lock shaft 66 extends through a horizontal lock shaft 62, FIGS. 8, 9, 10 and 11 disposed parallel to the operation lever 61, and is height-adjustably fixed by an adjusting nut 62a. The lock shaft 66 and lock shaft base 67 are integrally formed.

Lock lever mounting bars 62b are fixed to the horizontal lock shaft 62, and swivels with the pivotal movement of the horizontal lock shaft 62. Lock rollers 63 are rotatably fixed to roller mounting shafts 64 at the lower end of the lock lever mounting bars to press down the opening side of the locking block 70c. A stopping block 72 is mounted on a block mounting platform 65 provided on the periphery of the upper rotary housing 10, and provided with a stop recess 72a at its side wall-to receive a stop bolt 73 projecting from the lower portion of the locking block 70c. An elevatable lever operation block 74 is provided above the stopping block 72. A lock cylinder 60 is fitted into the lever operation block 74. A cylinder rod 60a of the lock cylinder 60 is fit into the stopping block 72 to move the lever operation block 74 upwardly and downwardly. The lever operation block 74 is formed with a lever operation recess 74a to receive the operation lever 61. An elevation guide 75 is erected upwardly of the stopping block 72, and slidably fitted into the lever operation block 74 to guide the lever operation block 74 to be raised or lowered.

Referring to FIG. 1 and FIGS. 12 to 14, the operation of the present invention will be hereinafter described. A cassette 54 accommodating multiple substrates 1 is prepared at the loader B, and an empty cassette 54 is provided at the unloader D. By the operation of the controller F, the transportation robot C takes a substrate 1 out of the loader B, and supplies the substrate 1 to the scrubbing station E. At this time, the substrate chuck 6 is expanded by means of the expansion head 14 as shown in FIG. 4, and the substrate 1 clamped at its periphery by the transportation robot C is inserted into the expanded chuck 6.

Figure 21:
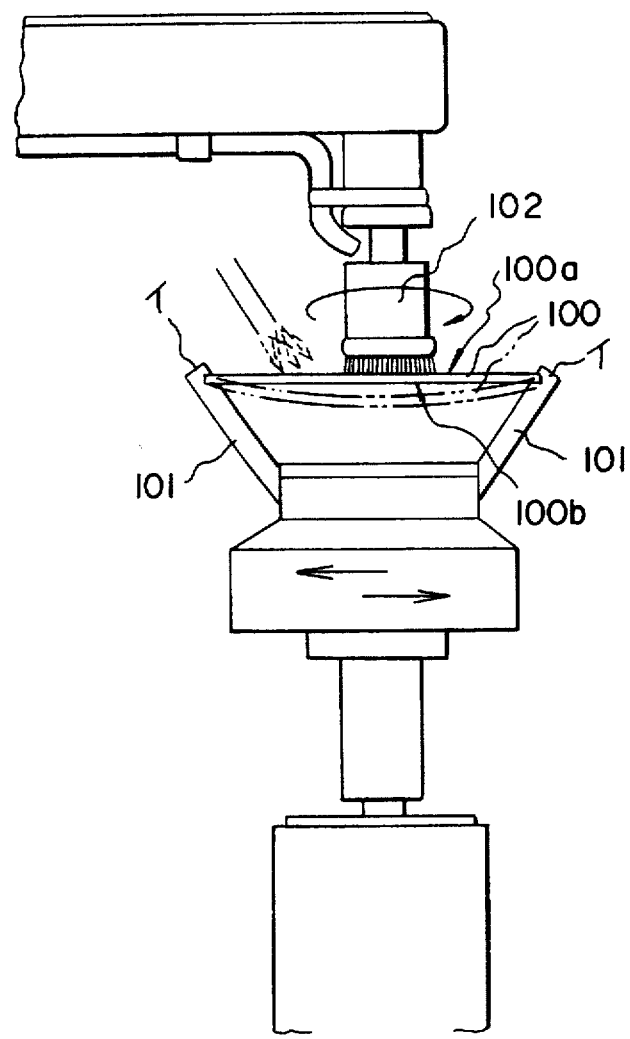
FIG. 21 is a schematic representation of a conventional scrubbing apparatus.

At this time, the substrate support rods 33 raised by means of the substrate support operation cylinder 31, FIG. 3 projects upward above the self-centering clamp groove 4 of the substrate, chuck 6 to abut against the scrub surface 1a of the substrate 1. When the substrate 1 is placed on the support heads 35, FIG. 21 of the substrate support rods 33, the transportation robot C disengages from the periphery of the substrate 1 to release the substrate onto the support heads 35. In turn, the substrate support operation cylinder 31 performs a reverse operation to move support rods 33 and substrate 1 downwardly and stops at a position such that the substrate 1 is aligned with the self-centering clamp groove 4. FIG. 6 showing an enlarged view illustrating the current structural relation between the substrate chuck 6 and substrate 1. As shown in phantom in FIG. 6, the substrate 1 is supported within the inside surface 4a of the substrate chuck 6 in a position slightly upper than the self-centering clamp groove 4. When the substrate chuck 6 is closed by the means of the chuck diameter reduction cylinder 15, the periphery of the substrate 1 is brought into contact with the upper slide oblique surface 4b of the self-centering clamp groove 4, and then moves downwardly along the upper slide oblique surface 4b so as to be exactly fitted into the inside surface 4a. At this time, the jaw 5 of the substrate chuck 6 abuts against the tapered lower face of the periphery of the substrate 1, and therefore the lower surface of the substrate chuck 6 does not project downwardly of the scrub surface 1a of the substrate 1.

After the substrate 1 is clamped by the self-centering clamp groove 4 in a self-centering manner, the substrate support rods 33 are further lowered by means of the substrate support operation cylinder 31 so as to be apart from the scrub surface 1a of the substrate 1. During this operation, the transportation robot C returns to the home position, and stands by for the completion of the scrubbing of the substrate 1 to remove the substrate scrubbed from the scrubbing station E. After the transportation robot C returns from a position above the substrate 1 to the home position, the back pressure paddle, FIG. 14, 7 moves down and stops right above the back pressure surface 1b of the substrate 1. On or after moving down, the back pressure paddle 7 jets the back pressure fluid 2 against the back pressure surface 1b of the substrate 1 to apply back pressure thereon. The cylindrical brush 3 standing by below the substrate 1 is moved upwardly by means of the brush elevation cylinder 38 so as to be brought into contact with the scrub surface 1a of the substrate 1. At the same time, wash liquid is jetted from the wash fluid jet nozzle 46 toward the cylindrical brush 3 to wet the cylindrical brush 3. The cylindrical brush 3 rotated by means of the brush driving motor 44 scrubs the scrub surface 1a of the substrate 1. During the scrubbing operation by the cylindrical brush 3, the upper rotary housing 10 is rotated by means of the substrate rotating motor 21 to rotate the substrate 1 chucked by the substrate chuck 6 within the plane of the substrate 1. Since the scrub surface 1a of the substrate 1 brought into line contact with the cylindrical brush 3 is rotated within the plane thereof, the entire scrub surface 1a of the substrate 1 is scrubbed by the cylindrical brush 3 at a high speed.

In addition, since the cylindrical brush 3 extends outwardly beyond the circumference of the substrate 1 toward the substrate chuck 6 and the jaw 5 does not project downwardly of the scrub surface 1a as shown in FIG. 6, the entire scrub surface can be scrubbed without leaving almost any unscrubbed surface portion. As described above, a gas such nitrogen gas or liquid such as high purity water is used as the back pressure fluid 2 jetted from the back pressure paddle 7.

If a liquid is used as the back pressure fluid 2, a plurality of fluid drain through-holes 11 extending from the inside surface 4a to the lower surface of the substrate chuck 6 are provided along the self-centering clamp groove 4 and, therefore, during the rotation of the substrate chuck 6, the back pressure fluid on the substrate 1 is drained through the fluid drain through-holes 11 to the lower side of the substrate chuck 6, and no back pressure fluid remains undrained.

The fluid drain through-holes 11 are of oval or elliptical configuration, and the major axis of the through-hole extends along the tangent line of the annular self-centering clamp groove 4.

Figure 9:
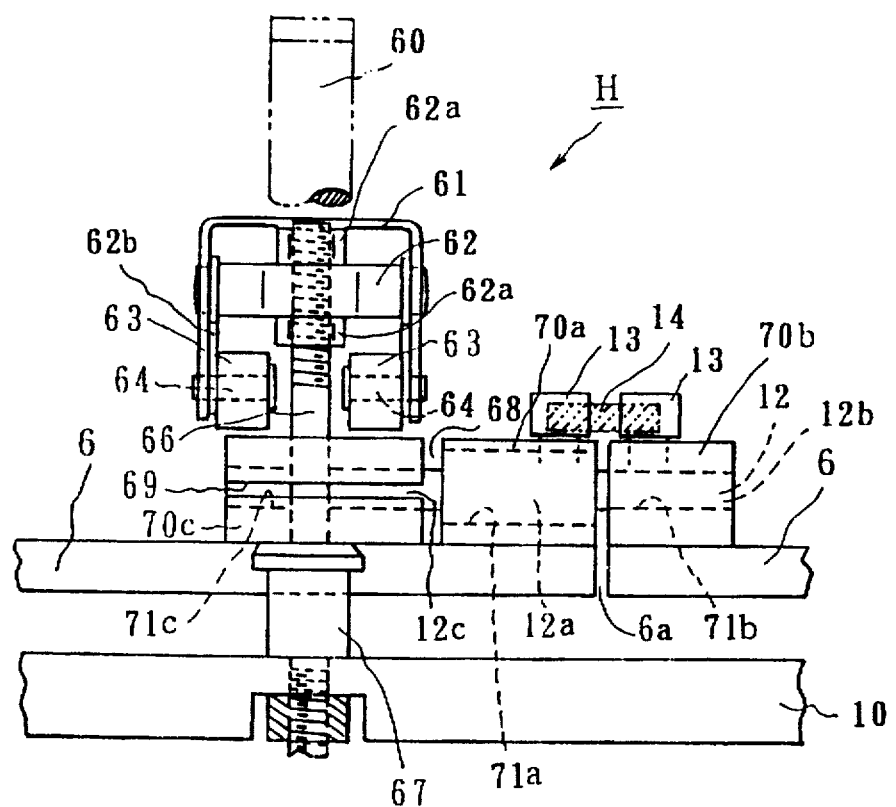
FIG. 9 is a front view of the lock mechanism shown in FIG. 8.
Figure 10:
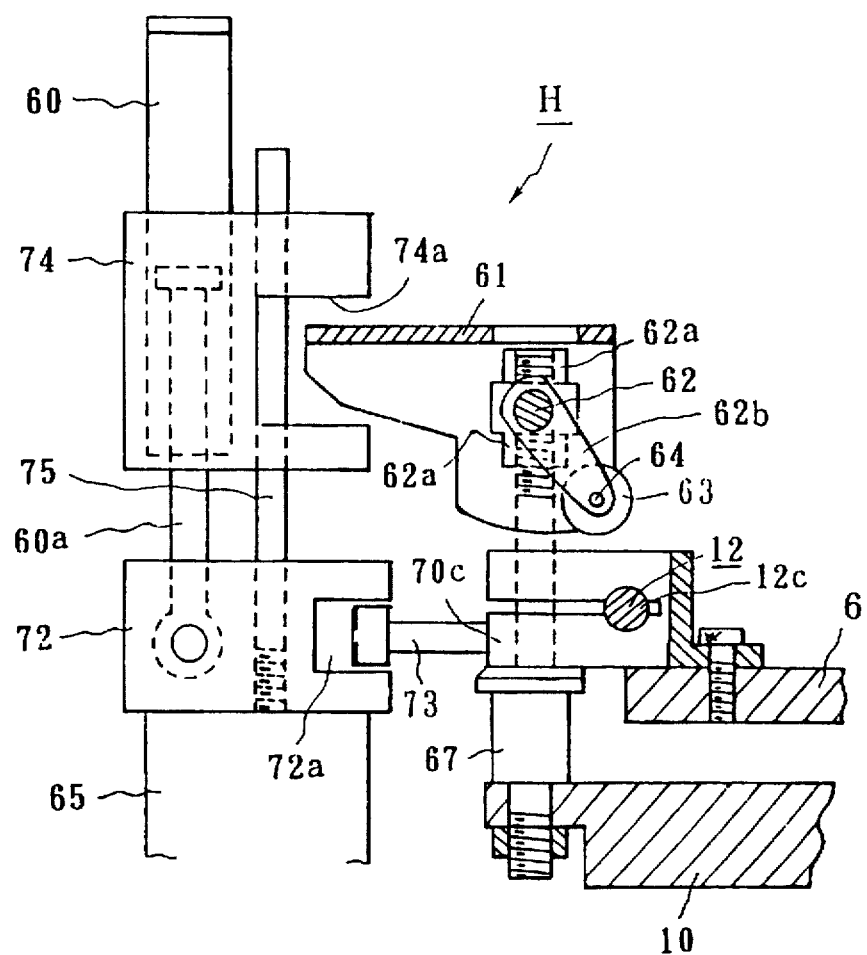
FIG. 10 is a partial side elevational view illustrating the lock mechanism before operation.
Figure 11:
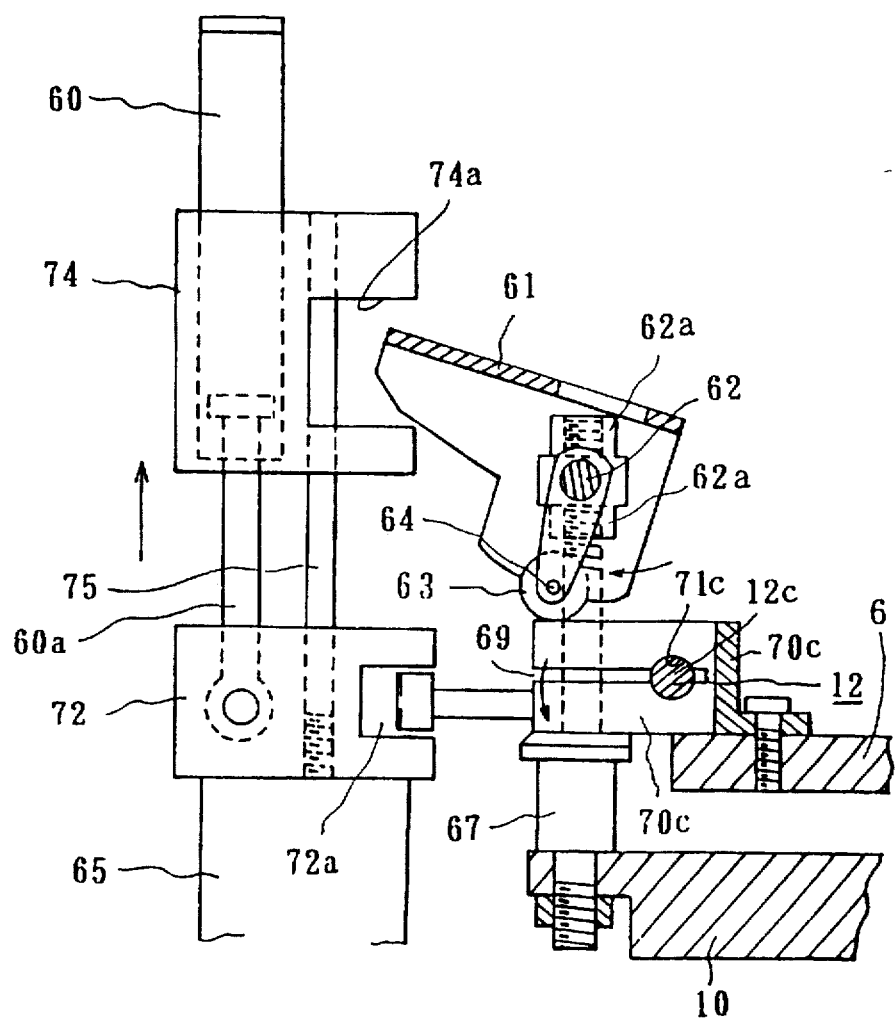
FIG. 11 is a partial side elevational view illustrating the lock mechanism after operation.
Figure 12:
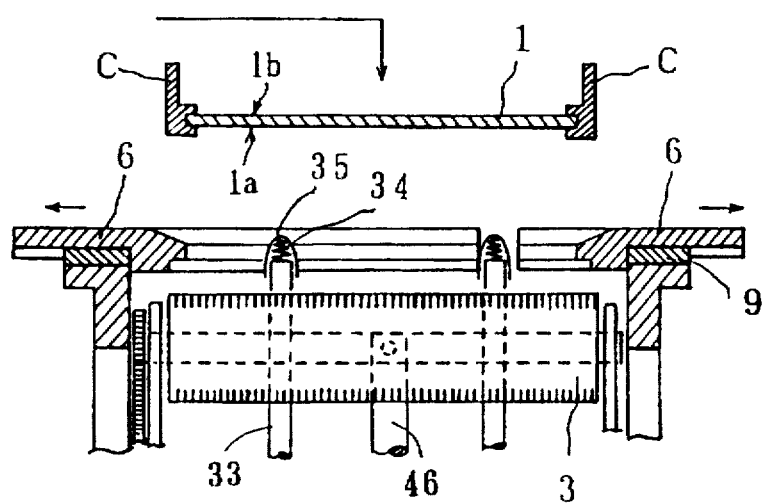
FIG. 12 is a schematic sectional view illustrating the scrubbing station before supplying a substrate.
Figure 13:
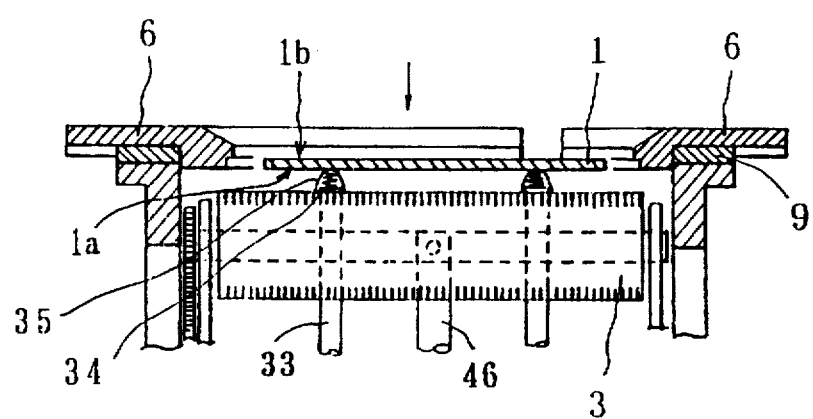
FIG. 13 is a schematic sectional view illustrating the scrubbing station supplied with a substrate.
Figure 14:
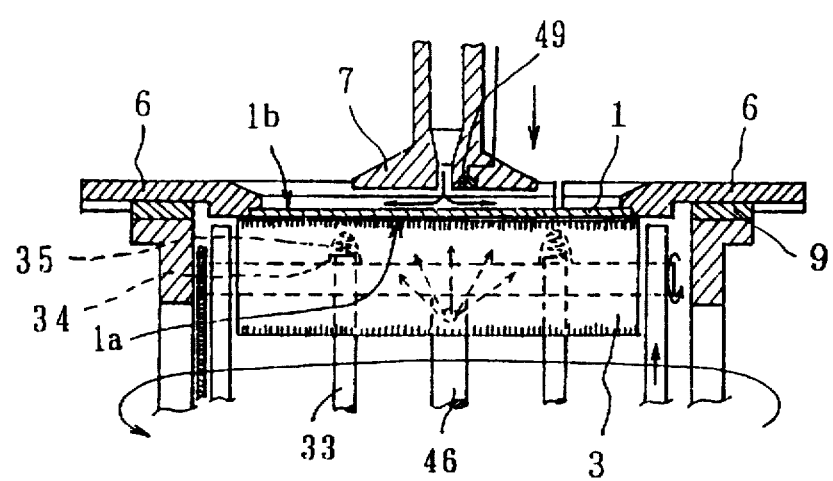
FIG. 14 is a schematic sectional view illustrating the scrubbing station in scrubbing operation.

There is now described the operation of the lock mechanism H FIGS. 8, 9, 10 and 11. When the substrate chuck 6 is rotated during the scrubbing, the substrate chuck pieces 6 are to be radially moved by the centrifugal force so that the chuck diameter of the self-centering groove 4 will be increased. However, the chuck diameter reduction cylinder 15, FIG. 4, reduces the chuck diameter of the substrate chuck 6. Thereafter, the lever operation block 74, FIG. 11, is raised by means of the lock cylinder 60, and the operation lever 61 engaged with the lever operation recess 74a is pivoted upwardly. The lock lever mounting bars 62b, FIG. 9 are swiveled clockwise (in the figure) about the horizontal lock shaft 62 fixed to the operation lever 61. The lock roller 63 is forcibly pressed down on the surface of the locking block 70c, FIG. 11, to shrink the gap of the locking slit 69, whereby the guide lock 12c inserted into the locking through-hole 71c is firmly gripped.

In this operation, when the lever operation block 74 is raised by means of the lock cylinder 60, a stopping bolt 73, FIG. 10, is engaged with the stopping recess 72a. Therefore, excessively large bending force is not exerted on the substrate chuck 6.

The lock roller 63 maintains the guide lock 12c in the locked state by the resilience, or the clicking action of the locking block 70c. When the substrate chuck 6 is rotated with this situation, the operation lever 61 and the stopping bolt 73 are disengaged respectively from the lever operation recess 74a and the stop recess 72a, and the substrate 1 is rotated with the substrate chuck 6 being kept in a locked state as shown in FIG. 11. Therefore, the lock cylinder 60 and members mounted thereon do not rotate with the substrate chuck 6. The lock mechanism H is rotated with the substrate chuck 6 in the locked state. However, since only the members necessary for locking are mounted on the substrate chuck 6, the reduced weight of the substrate chuck 6 facilitates the rotation of the substrate chuck 6.

When the scrub surface 1a of the substrate 1 is scrubbed by the cylindrical brush 3, the displacement sensor 49, FIG. 20, provided on the back pressure paddle 7 always detects the distance between the substrate 1 and the displacement sensor 49. The flow rate of the back pressure fluid 2 jetted against the back pressure surface 1b from the back pressure paddle 7 is controlled so that the distance between the substrate 1 and the displacement sensor 49 is kept constant, based on the feedback from the displacement sensor 49. Therefore, the contact pressure of the cylindrical brush 3 is properly balanced with the back pressure on the central portion of the substrate 1, whereby the entire scrub surface 1a of the substrate 1 can be sufficiently scrubbed.

In view of the relation between the back pressure paddle 7 and the cylindrical brush 3, the slit of the fluid jet outlet 7a, FIG. 3, of the back pressure paddle 7 extends along the cylindrical brush 3, so that the back pressure is linearly applied onto the substrate 1. Therefore, the scrub surface 1a of the substrate 1 kept afloat with its periphery being supported by the self-centering clamp groove 4 can be scrubbed with the cylindrical brush 3 by applying sufficient pressure thereto.

When the scrubbing of the substrate 1 is completed, the brush elevation cylinder 38, FIG. 3, performs a reverse operation and moves downwardly, whereby the cylindrical brush 3 moves away from the scrub surface 1a of the substrate 1. At the same time, the brush driving-motor 44 is turned off to stop the rotation of the cylindrical brush 3.

Figure 19:
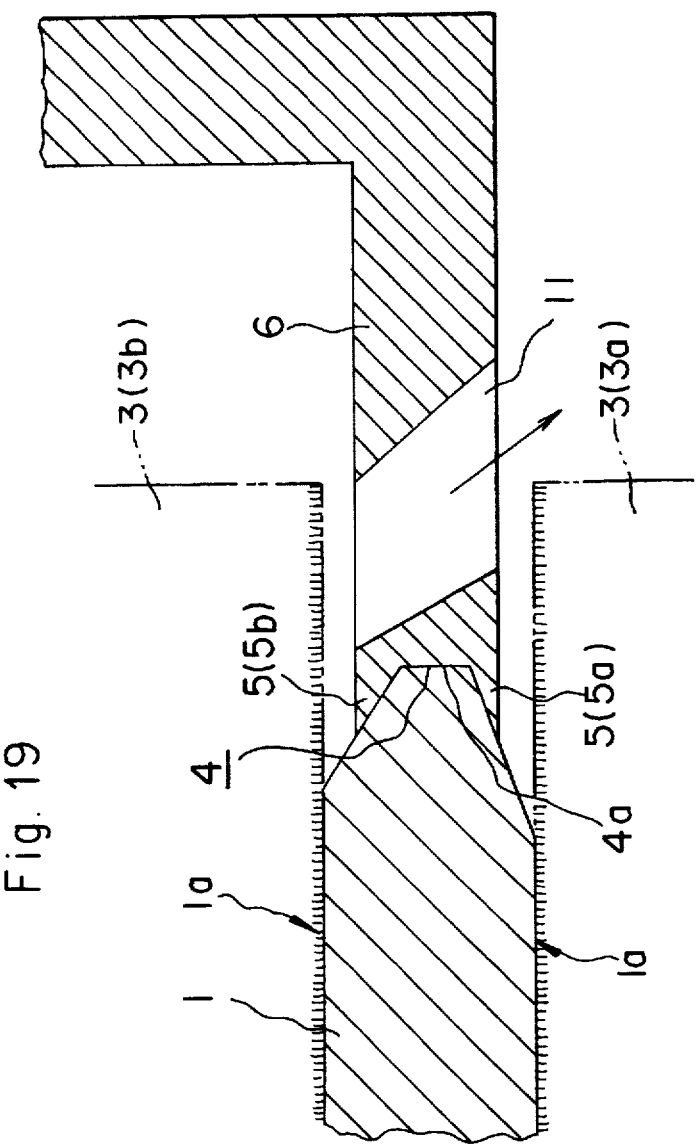
FIG. 19 is an enlarged sectional view for showing the relation between the substrate and clamp groove in both-face scrubbing process.

At this time, the discharge of the back pressure fluid 2 from the back pressure paddle 7 is stopped to cease applying the back pressure onto the substrate 1, and the back pressure paddle 7 is moved upwardly. Of course, the jetting of wash fluid from the wash fluid jet nozzle 46 is stopped. After the cylindrical brush 3 and the back pressure paddle 7 are moved away from the substrate 1, the revolution of the substrate rotating motor 21, FIG. 2, is increased, thereby increasing the rotation speed of the upper rotary housing 10. Accordingly, the liquid adhering on the surface of the substrate 1 is blown off by the centrifugal force and drained through the fluid drain through-holes 11, FIG. 19, and thus the substrate 1 is dried.

Electrostatic charge may be generated on the substrate 1 by the friction caused by the contact between substrate 1 and rotating cylindrical brush 3 and/or the wash liquid such as high purity water during the scrubbing operation, and also by the friction caused by the contact between the substrate 1 and the ambient air during the drying operation by the high speed revolution. However, the electrostatic charge on the substrate 1 can be removed by the aforementioned charge removal mechanism, that is, by irradiating ultraviolet ray on the substrate 1 with the charge removal means J during and after the drying operation.

After the drying and charge removal of the substrate 1, the substrate chuck 6 is stopped rotating at an exact position such that the operation lever 61 is aligned with the lever operation block 74. To precisely control the stop position of the operation lever 61, the positioning sensor 23 detects the rotational position of the upper-rotary housing 10 to fit the positioning cam follower 23 into the positioning cam 22.

When the operation lever 61 is stopped at the position aligning with the lever operation block 74 and the operation lever 61 is received into the lever operation recess 74a, the lock cylinder 60 performs a reverse operation to lower the lever operation block 74, thereby pressing down the operation lever 61 fitted into the lever operation recess 74a. Further, the lock lever mounting bars 62b are swiveled counterclockwise (in the figure) about the horizontal lock shaft 62 fixed to the operation lever 61, so that the lock roller 63 is disengaged from the surface of the locking block 70c. Accordingly, the locking slit 69 is widened by the resilient force of the locking block 70c, and the guide lock 12c is released from the gripping of the locking through-hole 71c to become slidable.

Thereafter, the expansion cylinder head 14 is inserted again between the pair of the expansion rollers to expand the clearance 6a as shown in FIG. 4. Accordingly, the diameter defined by the inside surface 4a of the substrate chuck 6 is increased, whereby the substrate 1 is released from the self-centering clamp groove 4.

There is now described the operation after the upper-rotary housing 10 is stopped. After the upper-rotary housing 10 is stopped, the substrate support operation cylinder 31 operates again to raise the substrate support rods 33, so that the cushion members 34 provided at the tips of the substrate support rods 33 are brought into contact with the scrub surface 1a of the substrate 1. At this time, the support heads 35 are slightly deformed by the spring force of the cushion members 34, FIG. 18.

After the scrub surface 1a of the substrate 1 is supported by the support heads 35, the substrate chuck 6 is expanded as described above, and the substrate 1 is released from the self-centering clamp groove 4 of the substrate chuck 6 and supported only by the support heads 35. The substrate support operation cylinder 31 is operated with this situation to eject the substrate 1 upwardly of the substrate chuck 6. The ejected substrate 1 is removed by the transportation robot C.

The transportation robot C once returns to the home position, and then transports the substrate 1 to the unloader D. At this time, electrostatic charge generated by the friction between the substrate 1 and the ambient air is removed by the ultraviolet ray generating lamp 88 provided as a charge removal means at the home position of the transportation robot C.

After the uncharged substrate 1 is transported to the unloader D by the transportation robot C, the substrate 1 is inserted into the empty cassette 54 mounted on the unloader D. Thus, the one-face scrubbing (or back-face scrubbing) of one substrate is completed.

In some cases, both-face scrubbing (or front- and back-face scrubbing) may be required depending on the types of substrates 1 or by a request from manufacturing sites. There is now briefly described the both-face scrubbing. A substrate chuck 6 for both-face scrubbing has a clamp portion, the width of which is less than the thickness of a substrate 1. A self-centering clamp groove 4 is formed on the inside circumference of the clamp portion, and the tapered periphery of the substrate 1 is chucked by the substrate supporting jaws 5a and 5b of a jaw member 5.

Brushes 3a and 3b movable upwardly and downwardly are brought into contact with the both faces of the substrate 1 to simultaneously scrub the both faces of the substrate 1. Accordingly, the difference between the both-face scrubbing and one-face scrubbing shown in the first embodiment is that the back pressure paddle 7 is replaced by an upper side brush 3b.

After the completion of the scrubbing, the scrubbed substrate 1 is removed from the scrubbing station E, transported to an unloader D, and inserted to an empty cassette 54 mounted on the unloader D by a transportation robot C. Thus, the both-face scrubbing of the substrate 1 is completed. In this case, charge removal means J are disposed on the both sides of the substrate 1 to apply ultraviolet ray onto the both faces of the substrate 1.

The method and apparatus for scrubbing substrate of the present invention present an excellent ability to scrub either face or both faces of a semiconductor substrate. Since the contact pressure of a brush is balanced with an appropriate back pressure or the contact pressure of another brush provided on the side of the front face of the substrate during the scrubbing operation, the warpage of the central portion of the substrate can be prevented, whereby even the central portion of the substrate can be sufficiently scrubbed. In addition, since chuck jaw does not project outwardly of the scrub surface and therefore the cylindrical brush can be applied onto the substrate over the chuck jaw, no portion of the-substrate remains unscrubbed. Further, since fluid drains are provided along a clamp groove, fluid on the substrate can be smoothly drained from the fluid drains by centrifugal force generated by the rotation of the substrate chuck and the substrate, and no fluid on the substrate remains undrained. Therefore, the front face as well as the back face of the substrate can be always kept clean.

Still further, since a charge removal means is provided, electrostatic charge can be removed even if the substrate is charged after scrubbing. Therefore, dust particles suspended in the air will not adhere on the scrubbed surface, and the substrate will be kept as clean as just after the scrubbing.

Although the present invention has been described in detail with respect to specific preferred embodiments thereof, various changes and modifications may be suggested to one skilled in the art and it is intended that the present invention encompasses such changes and modifications as fall within the scope of the appended claims.

What is claimed is:

1. A method for scrubbing a circular semiconductor substrate having a tapered outer periphery extending around said substrate comprising clamping said substrate to be scrubbed in a chuck extending circumferentially around said tapered outer periphery of said substrate so that said substrate is held firmly by said chuck with the tapered outer periphery of the substrate received in a clamp groove formed in the inner circumference of said chuck so that one face of the substrate faces upwardly and an opposite face of the substrate faces downwardly and said downwardly facing face protrudes relative to said chuck; and scrubbing said protruded face of said substrate facing upward with a cylindrical rotary brush having a length extending across the diameter of said substrate facing upward while applying back pressure to said upwardly facing face by jetting a back pressure fluid against said downwardly facing face so that the contact pressure of the brush against said downwardly facing face is balanced with said back pressure.

2. A method according to claim 1, further comprising, applying a wash liquid to at least one of said substrate faces while said at least one face is being scrubbed and, after scrubbing said at least one of said substrate faces, drying the scrubbed substrate and removing electrostatic charge resulting from such scrubbing from the substrate with an electrostatic charge removal means.

3. A method for scrubbing a circular semiconductor substrate having a tapered outer periphery extending around said substrate comprising clamping said substrate to be scrubbed in a chuck extending circumferentially around said tapered outer periphery of said substrate so that said substrate is held firmly by said chuck with the tapered outer periphery of the substrate received in a clamp groove formed in an inner circumference of said chuck and so that one face of said substrate faces upwardly and an opposite face of said substrate faces downwardly and said opposite faces protrude outwardly relative to said chuck; and scrubbing said opposite faces of said substrate with cylindrical rotary brushes disposed on said opposite faces of said substrate symmetrically with respect to said opposite faces, each of said brushes extending across the diameter of the substrate, and the contact pressure of the brush against one face of the substrate is balanced with the contact pressure of the brush against the other face of the substrate while said opposite faces of said substrate are being scrubbed.

4. A method according to claim 3, further comprising, applying a wash liquid to at least one of said opposite faces of said substrate being scrubbed, and after scrubbing said at least one of said opposite faces of said substrate, drying said scrubbed substrate and removing electrostatic charge resulting from such scrubbing from said dried substrate with an electrostatic charge removal means.

* * * * *